United States Patent
Zhang et al.

(10) Patent No.: US 11,283,039 B2
(45) Date of Patent: Mar. 22, 2022

(54) DISPLAY SUBSTRATE WITH IMPROVED CARRIER MOBILITY OF THIN FILM TRANSISTORS WITHIN GOA REGION

(71) Applicant: BOE TECHNOLOGY GROUP CO., LTD., Beijing (CN)

(72) Inventors: Wenlin Zhang, Beijing (CN); Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/956,983

(22) PCT Filed: Feb. 18, 2020

(86) PCT No.: PCT/CN2020/075727
§ 371 (c)(1),
(2) Date: Jun. 22, 2020

(87) PCT Pub. No.: WO2020/207119
PCT Pub. Date: Oct. 15, 2020

(65) Prior Publication Data
US 2021/0135144 A1    May 6, 2021

(30) Foreign Application Priority Data
Apr. 11, 2019    (CN) .......................... 201910289224.1

(51) Int. Cl.
*H01L 29/08* (2006.01)
*H01L 51/50* (2006.01)
*H01L 51/56* (2006.01)

(52) U.S. Cl.
CPC .......... *H01L 51/5048* (2013.01); *H01L 51/56* (2013.01); *H01L 2251/306* (2013.01); *H01L 2251/308* (2013.01)

(58) Field of Classification Search
CPC .................................................. H01L 51/5048
See application file for complete search history.

(56) References Cited

U.S. PATENT DOCUMENTS

| | | |
|---|---|---|
| 10,002,970 B2 | 6/2018 | Koezuka et al. |
| 2010/0072470 A1* | 3/2010 | Yamazaki ............... G02F 1/133 |
| | | 257/43 |

(Continued)

FOREIGN PATENT DOCUMENTS

| | | |
|---|---|---|
| CN | 101794809 A | 8/2010 |
| CN | 104681625 A | 6/2015 |

(Continued)

OTHER PUBLICATIONS

Office Action dated Sep. 1, 2020 in Chinese Application No. 201910289224.1 (12 pages).

(Continued)

*Primary Examiner* — Caleb E Henry
(74) *Attorney, Agent, or Firm* — Muncy, Geissler, Olds & Lowe, P.C.

(57) ABSTRACT

The present disclosure relates to the field of display technology, and provides a display substrate, its manufacturing method, and a display device. The display substrate includes a display region and a GOA region. An active layer of a TFT at the GOA region at least includes a first oxide semiconductor layer and a second oxide semiconductor layer arranged on the first oxide semiconductor layer, and the first oxide semiconductor layer is arranged between the second oxide semiconductor layer and a base substrate of the display substrate and has a carrier mobility of smaller than the second oxide semiconductor layer.

17 Claims, 3 Drawing Sheets

(56) References Cited

U.S. PATENT DOCUMENTS

| | | | |
|---|---|---|---|
| 2010/0176383 A1* | 7/2010 | Park | H01L 27/3262 257/40 |
| 2014/0042433 A1* | 2/2014 | Yamazaki | H01L 29/7869 257/43 |
| 2014/0183527 A1* | 7/2014 | Yamazaki | H01L 29/24 257/43 |
| 2015/0123116 A1 | 5/2015 | Goto et al. | |
| 2015/0228803 A1 | 8/2015 | Koezuka et al. | |
| 2016/0329353 A1* | 11/2016 | Goto | H01L 29/786 |
| 2017/0309649 A1* | 10/2017 | Hayashi | H01L 29/78696 |
| 2017/0358508 A1* | 12/2017 | Xue | H01L 27/124 |
| 2018/0011355 A1* | 1/2018 | Miyake | H01L 29/7869 |
| 2018/0182785 A1* | 6/2018 | Chen | H01L 21/02502 |
| 2018/0219102 A1 | 8/2018 | Koezuka et al. | |
| 2018/0350995 A1* | 12/2018 | Kim | H01L 29/24 |
| 2019/0198679 A1* | 6/2019 | Misaki | H01L 29/7869 |
| 2020/0124899 A1* | 4/2020 | Saitoh | H01L 27/1225 |
| 2020/0203534 A1* | 6/2020 | Park | H01L 29/24 |
| 2020/0273930 A1* | 8/2020 | Zhou | H01L 51/56 |
| 2020/0287054 A1* | 9/2020 | Suzuki | H01L 29/66969 |
| 2020/0295052 A1* | 9/2020 | Hideo | H01L 27/1225 |
| 2021/0036158 A1* | 2/2021 | Nishimiya | H01L 29/24 |
| 2021/0135014 A1* | 5/2021 | Kim | G09G 3/3225 |

FOREIGN PATENT DOCUMENTS

| | | |
|---|---|---|
| CN | 106057826 A | 10/2016 |
| CN | 110010626 A | 7/2019 |
| TW | 201533912 A | 9/2015 |

OTHER PUBLICATIONS

International Search Report dated May 8, 2020 in Application No. PCT/CN2020/075727 (16 pages).

* cited by examiner

US 11,283,039 B2

DISPLAY SUBSTRATE WITH IMPROVED CARRIER MOBILITY OF THIN FILM TRANSISTORS WITHIN GOA REGION

CROSS-REFERENCE TO RELATED APPLICATIONS

The present application is the U.S. national phase of PCT Application No. PCT/CN2020/075727 filed on Feb. 18, 2020, which claims a priority of the Chinese patent application 201910289224.1 filed on Apr. 11, 2019, which are incorporated herein by reference in their entirety.

TECHNICAL FIELD

The present disclosure relates to the field of display technology, in particular to a display substrate, its manufacturing method, and a display device.

BACKGROUND

The display technology is moving in a direction of a larger resolution and a narrower bezel, and it is currently an important trend in the development of an Organic Light-Emitting Diode (OLED) display product to provide a narrow bezel.

SUMMARY

In one aspect, the present disclosure provides in some embodiments a display substrate, including a display region and a gate driver on array (GOA) region. An active layer of a thin film transistor (TFT) at the GOA region at least includes a first oxide semiconductor layer and a second oxide semiconductor layer arranged on the first oxide semiconductor layer, and the first oxide semiconductor layer is arranged between the second oxide semiconductor layer and a base substrate of the display substrate and has a carrier mobility of smaller than the second oxide semiconductor layer.

In some possible embodiments of the present disclosure, an active layer of a TFT at the display region merely includes the first oxide semiconductor layer.

In some possible embodiments of the present disclosure, the carrier mobility of the second oxide semiconductor layer is more than 30 cm$^2$/(V·S).

In some possible embodiments of the present disclosure, the second oxide semiconductor layer is made of IGZYO or IGTO, where Y represents Sn.

In some possible embodiments of the present disclosure, a content of In is six times of a content of Ga in the second oxide semiconductor layer, and a content of O accounts for 10% to 35%.

In some possible embodiments of the present disclosure, contents of elements in IGZYO meet an equation of In:Ga:Zn:Sn=6:1:4:1.

In some possible embodiments of the present disclosure, the first oxide semiconductor layer is made of IGZO.

In some possible embodiments of the present disclosure, the first oxide semiconductor layer has a thickness of 300 to 500 Å.

In some possible embodiments of the present disclosure, the TFT is a top-gate TFT.

In some possible embodiments of the present disclosure, the second oxide semiconductor layer has a thickness of 300 to 500 Å.

In some possible embodiments of the present disclosure, the TFT at the GOA region has a carrier mobility within a range from 20.5 cm$^2$/(V·S) to 30.2 cm$^2$/(V·S).

In another aspect, the present disclosure provides in some embodiments a display device including the above-mentioned display substrate.

In some possible embodiments of the present disclosure, the display device is an OLED display device.

In yet another aspect, the present disclosure provides in some embodiments a method for manufacturing a display substrate, the display substrate including a display region and a GOA region, the method including forming a first oxide semiconductor layer and a second oxide semiconductor layer sequentially at the GOA region, and patterning the second oxide semiconductor layer and the first oxide semiconductor layer to form an active layer of a TFT. The first oxide semiconductor layer has a carrier mobility smaller than the second oxide semiconductor layer.

In some possible embodiments of the present disclosure, the method further includes forming an active layer of a TFT at the display region by the first oxide semiconductor layer.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
FIG. 1 is a schematic view showing a display substrate with a light-shielding layer according to some embodiments of the present disclosure.

REFERENCE SIGN LIST 1 base substrate
2 light-shielding layer
3 buffer layer
4 first oxide semiconductor layer 5 second oxide semiconductor layer
6 gate insulation layer
7 gate metal layer
8 passivation layer
9 first via-hole
10 second via-hole
11 source/drain metal layer
12 passivation layer

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, in order to increase a carrier mobility of a TFT at a GOA region, an active layer of the TFT at the GOA region consists of two IGZO layers. An oxygen content in a lower IGZO layer (i.e., the IGZO layer between an upper IGZO layer and a substrate) is adjusted so as to increase the carrier mobility of the TFT at the GOA region. However, on one hand, the performance stability of the TFT may be adversely affected, and on the other hand, the carrier mobility is increased limitedly, i.e., the carrier mobility of the TFT is merely increased from about 10 $cm^2/(V·S)$ up to 11-12 $cm^2/(V·S)$.

An object of the present disclosure is to provide a display substrate, its manufacturing method and a display device, so as to provide a display product with a narrow bezel.

The present disclosure provides in some embodiments a display substrate, which includes a display region and a GOA region. An active layer of a TFT at the GOA region at least includes a first oxide semiconductor layer and a second oxide semiconductor layer arranged on the first oxide semiconductor layer, and the first oxide semiconductor layer is arranged between the second oxide semiconductor layer and a base substrate of the display substrate and has a carrier mobility of smaller than the second oxide semiconductor layer.

According to the embodiments of the present disclosure, the active layer of the TFT at the GOA region may include the first oxide semiconductor layer and the second oxide semiconductor layer arranged on the first oxide semiconductor layer, and the first oxide semiconductor layer may have the carrier mobility smaller than the second oxide semiconductor layer. In this regard, the second oxide semiconductor layer may be made of an oxide semiconductor material having a high carrier mobility, e.g., IGZYO or IGTO. When the carrier mobility of the TFT at the GOA region has been increased, it is able to reduce a width of the TFT at the GOA region, thereby to provide the display substrate with a narrow bezel.

In the embodiments of the present disclosure, the TFT may be a top-gate TFT or a bottom-gate TFT.

In the embodiments of the present disclosure, the display substrate may include the display region and the GOA region, the display region may be used for display, and the GOA region may surround the display region.

The active layer of the TFT at the GOA region may include two or more oxide semiconductor layers. In some possible embodiments of the present disclosure, the active layer of the TFT at the GOA region may consist of two oxide semiconductor layers laminated one on the other, so as to simplify the structure of the active layer of the TFT and simplify the manufacture process of the TFT, thereby to reduce the manufacture of the display substrate.

Further, an active layer of a TFT at the display region may be the first oxide semiconductor layer. It is unnecessary to reduce a width of the TFT at the display region, so the first oxide semiconductor layer with excellent stability, e.g., an IGZO layer, may be still used as the active layer of the TFT at the display region.

In some possible embodiments of the present disclosure, the carrier mobility of the second oxide semiconductor layer may be greater than 30 $cm^2/(V·S)$, so as to provide the TFT at the GOA region with a high carrier mobility.

To be specific, the second oxide semiconductor layer may be made of IGZYO or IGTO, where Y represents Sn. The second oxide semiconductor layer has such a characteristic as a high content of In. Usually, the content of In is six times of a content of Ga, so as to ensure that the carrier mobility of the second oxide semiconductor layer is greater than 30 $cm^2/(V·S)$. In addition, in order to ensure the carrier mobility, a content of O in the second oxide semiconductor layer may be 10% to 35%, e.g., 10%, 15%, 20% or 25%. However, the content of O shall be less than 30% as possible. This is because, the larger the content of O is, the lower the carrier mobility of the second oxide semiconductor layer is.

To be specific, the first oxide semiconductor layer may be made of IGZO which has excellent stability. The first oxide semiconductor layer may have a thickness of 300 to 500 Å, so as to, on one hand, increase the carrier mobility of the TFT at the GOA region, and on the other hand, ensure the performance stability of the TFT at the GOA region.

For example, the active layer of the TFT at the GOA region may consist of an IGTO layer and an IGZO layer laminated one on another. Through designing thicknesses of the IGTO layer and the IGZO layer, for the TFT at the GOA region, a threshold voltage Vth may be up to 1.28V, a subthreshold swing SS may be up to 0.29, $I_{on}$=5.6 mA, $I_{off}$=2.8*$E^{-12}$ and $I_{on}/I_{off}$=2*$E^9$. Through an equation for calculating a saturated carrier mobility, the carrier mobility of the TFT at the GOA region may be up to 30.2 $cm^2/(V·S)$. As compared with the active layer consisting of two IGZO layers, a leakage current of the TFT and a value of $I_{on}/I_{off}$ may be reduced obviously, so as to provide the TFT with better stability.

For another example, the active layer of the TFT at the GOA region may consist of an IGZYO layer and an IGZO layer laminated one on another. Through designing thicknesses of the IGZYO layer and the IGZO layer, for the TFT at the GOA region, a threshold voltage Vth may be up to 1.1V, an SS may be up to 0.31, $I_{on}$=1.1 mA, $I_{off}$=6.3*$E^{-12}$ and $I_{on}/I_{off}$=7.1*$E^8$. Through the equation for calculating a saturated carrier mobility, the carrier mobility of the TFT at the GOA region may be up to 20.5 $cm^2/(V·S)$. As compared with the active layer consisting of two IGZO layers, the leakage current of the TFT and the value of $I_{on}/I_{off}$ may be reduced obviously, so as to provide the TFT with better stability. When the TFT operates at a temperature of 70° C. for one hour, a Positive Bias Threshold Shift (PBTS) may be 4.0V (0.4V to 4.4V), or when the TFT is irradiated at 5000 nit for two hours, a Negative Bias Threshold and Illumination Shift (NBTIS) at 70° C. may be −2.6V (−0.4V to −3.0V).

The present disclosure further provides in some embodiments a display device including the above-mentioned display substrate. The display device may be any product or member having a display function, e.g., liquid crystal display (LCD) panel, OLED display panel, television, display, digital photo frame, mobile phone or flat-panel computer. The display device may further include a flexible circuit board, a printed circuit board and a back plate.

The present disclosure further provides in some embodiments a method for manufacturing a display substrate. The display substrate includes a display region and a GOA region. The method includes forming a first oxide semiconductor layer and a second oxide semiconductor layer sequentially at the GOA region, and patterning the second oxide semiconductor layer and the first oxide semiconductor layer to form an active layer of a TFT. The first oxide semiconductor layer has a carrier mobility smaller than the second oxide semiconductor layer.

According to the embodiments of the present disclosure, the active layer of the TFT at the GOA region may include the first oxide semiconductor layer and the second oxide semiconductor layer arranged on the first oxide semiconductor layer, and the first oxide semiconductor layer may have the carrier mobility smaller than the second oxide semiconductor layer. In this regard, the second oxide semiconductor layer may be made of an oxide semiconductor material having a high carrier mobility, e.g., IGZYO or IGTO. When the carrier mobility of the TFT at the GOA region has been increased, it is able to reduce a width of the TFT at the GOA region, thereby to provide the display substrate with a narrow bezel.

In the embodiments of the present disclosure, the display substrate may include the display region and the GOA region, the display region may be used for display, and the GOA region may surround the display region.

The active layer of the TFT at the GOA region may include two or more oxide semiconductor layers. In some possible embodiments of the present disclosure, the active layer of the TFT at the GOA region may consist of two oxide semiconductor layers laminated one on the other, so as to simplify the structure of the active layer of the TFT and simplify the manufacture process of the TFT, thereby to reduce the manufacture of the display substrate.

The method may further include forming an active layer of a TFT at the display region by the first oxide semiconductor layer. It is unnecessary to reduce a width of the TFT at the display region, so the first oxide semiconductor layer with excellent stability, e.g., an IGZO layer, may be still used as the active layer of the TFT at the display region.

The method will be described hereinafter in conjunction with the drawings and embodiments when the TFT is a top-gate TFT. The method may include the following steps.

Step 1: as shown in FIG. 1, providing a base substrate 1 and forming a light-shielding layer 2 on the base substrate 1.

The base substrate 1 may be a flexible or rigid substrate. The flexible substrate may be may be a polyimide (PI) substrate, and the rigid substrate may be a glass or quartz substrate.

To be specific, a metallic thin film may be formed on the base substrate 1 through sputtering or thermal evaporation, and then patterned to form a pattern of the light-shielding layer 2. The metallic thin film may be made of Cu, Al, Ag, Mo, Cr, Nd, Ni, Mn, Ti, Ta or W, or an alloy thereof. The metallic thin film may be of a single-layered structure, or a multi-layered structure such as Cu/Mo, Ti/Cu/Ti or Mo/Al/Mo. The light-shielding layer 2 may shield the active layer of the TFT, so as to prevent the performance of the TFT from being adversely affected when the active layer is irradiated by an external light beam.

Figure 2:
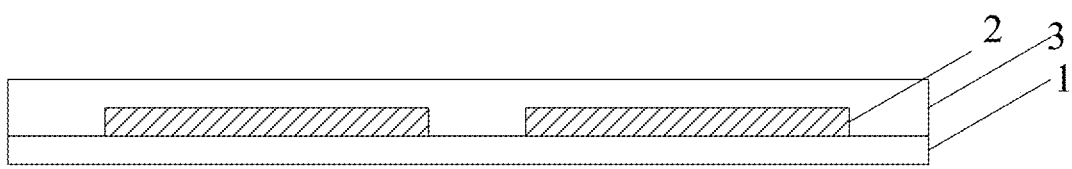
FIG. 2 is a schematic view showing the display substrate with a buffer layer according to some embodiments of the present disclosure.

Step 2: as shown in FIG. 2, forming a buffer layer 3.

Through the buffer layer 3, it is able to prevent ions in the glass or quartz substrate from entering the TFT, thereby to prevent the performance of the TFT from being adversely affected. To be specific, the buffer layer may be made of an oxide, a nitride or an oxynitride, e.g., SiNx, $SiO_2$, or both. A thickness of the buffer layer 3 may be 2000 to 4000 Å.

Figure 3:
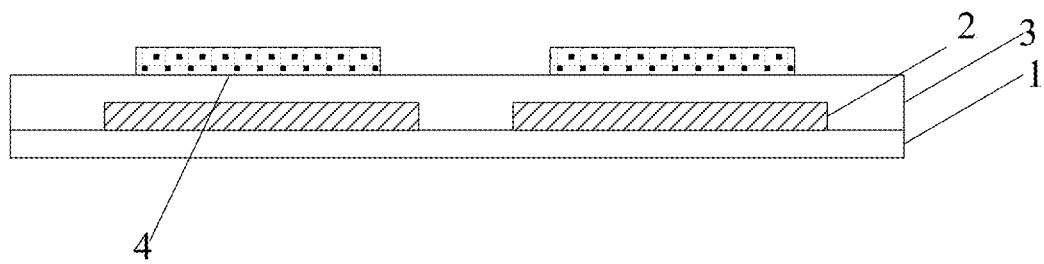
FIG. 3 is a schematic view showing the display substrate with a first oxide semiconductor layer according to some embodiments of the present disclosure.

Step 3: as shown in FIG. 3, forming the first oxide semiconductor layer 4 on the buffer layer 3 at the GOA region and the display region.

The first oxide semiconductor layer 4 may be made of IGZO and have a thickness of 300 to 500 Å. IGZO may be deposited at existing deposition power and pressure, but an oxygen content of IGZO needs to be controlled within a range of 10% to 30%. The oxygen content needs to be smaller than 30% as possible, so as to prevent the carrier mobility of the TFT from being increased too little.

To be specific, a first oxide semiconductor material may be deposited onto the buffer layer 3, and then patterned to form a pattern of the first oxide semiconductor layer 4.

Figure 4:
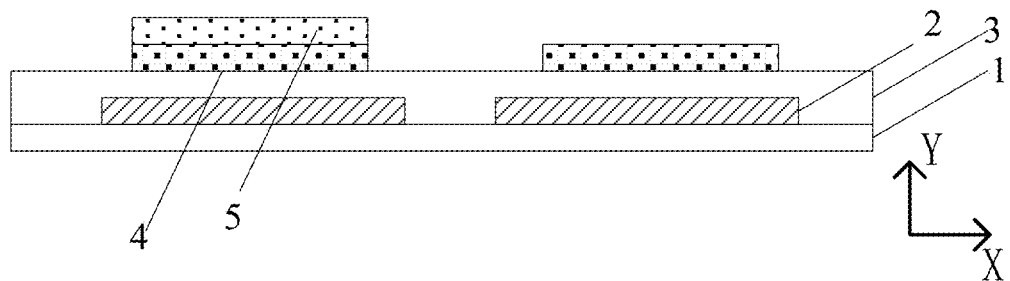
FIG. 4 is a schematic view showing the display substrate with a second oxide semiconductor layer according to some embodiments of the present disclosure.

Step 4: as shown in FIG. 4, forming the second oxide semiconductor layer 5 at the GOA region.

To be specific, a second oxide semiconductor material may be deposited, and then patterned to form a pattern of the second oxide semiconductor layer 5.

The second oxide semiconductor layer 5 may be made of an oxide semiconductor material having a high carrier mobility, e.g., IGZYO or IGTO, where Y represents Sn, and In:Ga:Zn:Sn=6:1:4:1. Generally speaking, a content of In is about six times of a content of Ga, so as to ensure that the carrier mobility of the active layer is greater than 30 $cm^2$/(V·S). In addition, as shown in FIG. 4, a thickness of the second oxide semiconductor layer 5 may be identical or similar to the thickness of the first oxide semiconductor layer 4, e.g., within the range of 300 to 500 Å. Furthermore, in order to ensure the carrier mobility of the active layer, an oxygen content needs to be within the range of 10% to 35%. For example, the oxygen content of IGZYO or IGZO may be 10%, 15%, 20% or 25%. The oxygen content needs to be smaller than 30% as possible, so as to prevent the carrier mobility of the TFT from being decreased.

At the GOA region, the second oxide semiconductor layer 5 and the first oxide semiconductor layer 4 may be laminated one on another (in a direction Y shown in FIG. 4) to form the active layer of the TFT at the GOA region. At the display region, the first oxide semiconductor layer 4 may serve as the active layer of the TFT at the display region. As shown in FIG. 4, the display region is located at a right side of the GOA region in a direction X.

Figure 5:
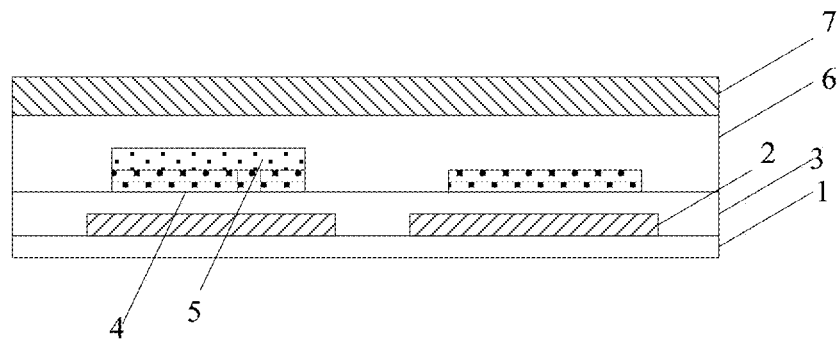
FIG. 5 is a schematic view showing the display substrate with a gate insulation layer and a gate metal layer according to some embodiments of the present disclosure.

Step 5: as shown in FIG. 5, forming a gate insulation layer 6 and a gate metal layer 7.

To be specific, the gate insulation layer 6 may be deposited at a temperature of 210 to 290° C. The gate insulation layer 6 may be made of $SiO_2$, and an oxygen content in an $SiO_2$ layer shall be increased as possible so as to ensure the characteristic of the oxide element with a high carrier mobility, because oxygen may be bonded to hydrogen in the active layer. A thickness of the gate insulation layer 6 may be within the range of 1000 to 2000 Å.

The gate metal layer 7 may be made of Cu, Al, Ag, Mo, Cr, Nb, Ni, Mn, Ti, Ta or W, or an alloy thereof. The gate metal layer 7 may be of a single-layered structure, or a multi-layered structure such as Cu/Mo, Ti/Cu/Ti or Mo/Al/Mo. A thickness of the gate metal layer 7 may be within the range of 3000 to 5000 Å.

Figure 6:
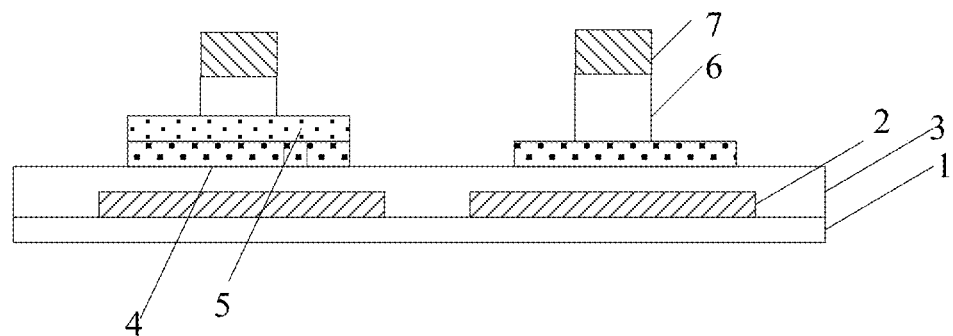
FIG. 6 is a schematic view showing the display substrate with patterns of the gate insulation layer and the gate metal layer according to some embodiments of the present disclosure.

Step 6: as shown in FIG. 6, patterning the gate insulation layer 6 and the gate metal layer 7, so as to form patterns of the gate insulation layer 6 and the gate metal layer 7.

To be specific, a photoresist may be applied onto the gate metal layer 7, and then exposed and developed so as to form a photoresist reserved region and a photoresist unreserved region. Next, the gate metal layer 7 at the photoresist unreserved region may be etched through a wet etching process, and the gate insulation layer 6 at the photoresist unreserved region may be etched through a dry etching process. Then, the remaining photoresist may be removed to form the patterns of the gate insulation layer 6 and the gate metal layer 7. An orthogonal projection of the gate insulation layer 6 onto the base substrate may coincide with an orthogonal projection of the gate metal layer 7 onto the base substrate. The pattern of the gate metal layer 7 may include a gate electrode and a gate line.

Figure 7:
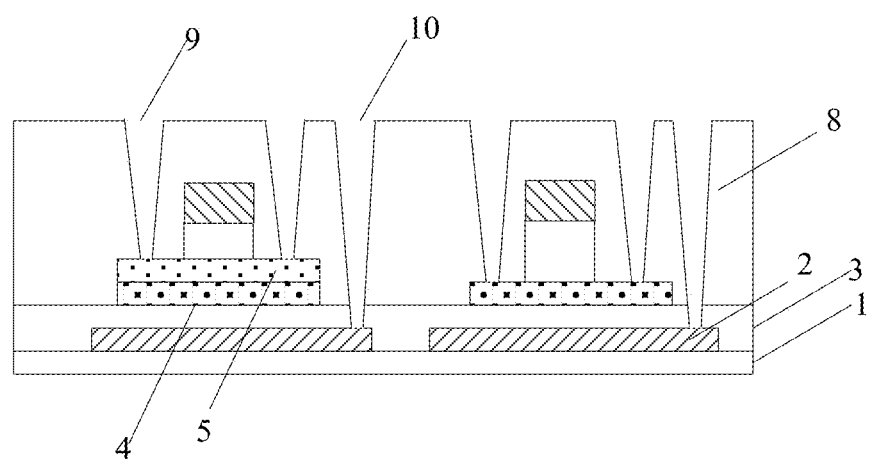
FIG. 7 is a schematic view showing the display substrate with an interlayer insulation layer according to some embodiments of the present disclosure.

Step 7: as shown in FIG. 7, forming an interlayer insulation layer 8.

The interlayer insulation layer 8 may be made of an oxide, a nitride or an oxynitride, and specifically it may consist of a $SiO_2$ layer, a SiON and a SiNx layer. A thickness of the interlayer insulation layer 8 may be within the range of 3000 to 5000 Å. The interlayer insulation layer 8 may be patterned, so as to form a first via-hole 9 for exposing the active layer and a second via-hole 10 for exposing the light-shielding layer.

Figure 8:
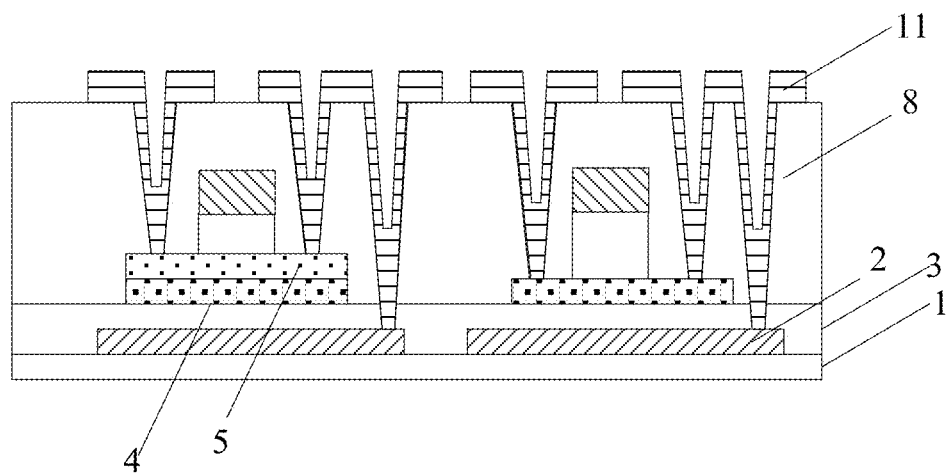
FIG. 8 is a schematic view showing the display substrate with a source/drain metal layer according to some embodiments of the present disclosure.

Step 8: as shown in FIG. 8, forming a source/drain metal layer 11.

The source/drain metal layer 11 may be made of Cu, Al, Ag, Mo, Cr, Nd, Ni, Mn, Ti, Ta or W, or an alloy thereof. The source/drain metal layer 11 may be of a single-layered structure, or a multi-layered structure such as Cu/Mo, Ti/Cu/Ti or Mo/Al/Mo. A thickness of the source/drain metal layer 11 may be within the range of 3000 to 5000 Å. Then, the source/drain metal layer 11 may be patterned to form a pattern of the source/drain metal layer 11. The pattern of the source/drain metal layer 11 may include a source electrode, a drain electrode and a data line.

The pattern of the source/drain metal layer 11 may be connected to the active layer through the first via-hole 9 and connected to the light-shielding layer 3 through the second via-hole 10. The light-shielding layer 3 may be connected in parallel to the pattern of the source/drain metal layer 11, so as to reduce a resistance of the pattern of the source/drain metal layer 11.

Figure 9:
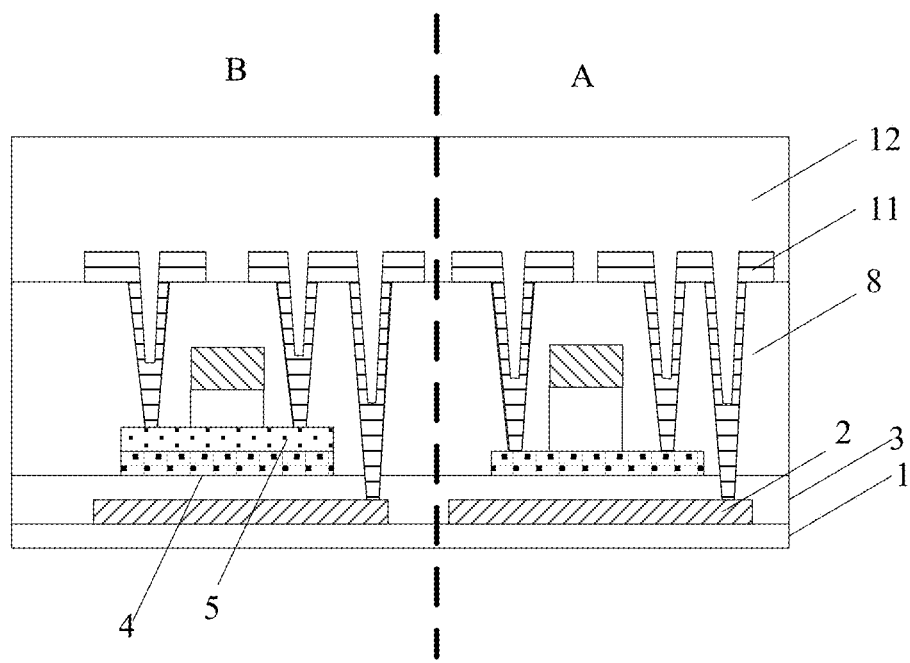
FIG. 9 is a schematic view showing the display substrate with a passivation layer according to some embodiments of the present disclosure.

Step 9: as shown in FIG. 9, forming a passivation layer 12.

The passivation layer 12 may be made of an oxide, a nitride or an oxynitride, e.g., $SiO_2$ or SiON, and a thickness of the passivation layer 12 may be within the range of 3000 to 4000 Å.

Through Steps 1 to 9, it is able to acquire a back plate of the top-gate display substrate. As shown by a region B on the left in FIG. 9, at the GOA region, the second oxide semiconductor layer 5 and the first oxide semiconductor layer 4 may be laminated one on another to form the active layer of the TFT at the GOA region. In addition, as shown by a region A on the right in FIG. 9, at the display region, the first oxide semiconductor layer 4 may serve as the active layer of the TFT at the display region. The second oxide semiconductor layer may be made of an oxide semiconductor material having a high carrier mobility, e.g., IGZYO or IGTO, and the first oxide semiconductor layer may be made of an oxide semiconductor material having excellent stability, e.g., IGZO. As a result, it is able to, on one hand, increase the carrier mobility of the TFT at the GOA region, and on the other hand, ensure the performance stability of the TFT at the GOA region. In addition, when the carrier mobility of the TFT at the GOA region has been increased, it is able to reduce a width of the TFT at the GOA region, thereby to provide the display substrate with a narrow bezel.

In the embodiments of the present disclosure, the order of the steps is not limited to the serial numbers thereof. For a person skilled in the art, any change in the order of the steps shall also fall within the scope of the present disclosure if without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a display region and a gate driver on array (GOA) region, wherein an active layer of a thin film transistor (TFT) at the GOA region at least comprises a first oxide semiconductor layer and a second oxide semiconductor layer arranged on the first oxide semiconductor layer, and the first oxide semiconductor layer is arranged between the second oxide semiconductor layer and a base substrate of the display substrate and has a carrier mobility of smaller than the second oxide semiconductor layer,
wherein an active layer of a TFT at the display region merely comprises the first oxide semiconductor layer.

2. The display substrate according to claim 1, wherein the carrier mobility of the second oxide semiconductor layer is more than 30 cm$^2$/(V·S).

3. The display substrate according to claim 1, wherein the second oxide semiconductor layer is made of IGZYO or IGTO, where Y represents Sn.

4. The display substrate according to claim 3, wherein a content of In is six times of a content of Ga in the second oxide semiconductor layer, and a content of O accounts for 10% to 35%.

5. The display substrate according to claim 4, wherein contents of elements in IGZYO meet an equation of In:Ga:Zn:Sn=6:1:4:1.

6. The display substrate according to claim 1, wherein the first oxide semiconductor layer is made of IGZO.

7. The display substrate according to claim 1, wherein the first oxide semiconductor layer has a thickness of 300 to 500 Å.

8. The display substrate according to claim 1, wherein the TFT is a top-gate TFT.

9. The display substrate according to claim 1, wherein the second oxide semiconductor layer has a thickness of 300 to 500 Å.

10. The display substrate according to claim 1, wherein the TFT at the GOA region has a carrier mobility within a range from 20.5 cm$^2$/(V·S) to 30.2 cm$^2$/(V·S).

11. A display device, comprising a display substrate, the display substrate comprising a display region and a gate driver on array (GOA) region, wherein an active layer of a thin film transistor (TFT) at the GOA region at least comprises a first oxide semiconductor layer and a second oxide semiconductor layer arranged on the first oxide semiconductor layer, and the first oxide semiconductor layer is arranged between the second oxide semiconductor layer and a base substrate of the display substrate and has a carrier mobility of smaller than the second oxide semiconductor layer, wherein an active layer of a TFT at the display region merely comprises the first oxide semiconductor layer.

12. The display device according to claim 11, wherein the display device is an Organic Light-Emitting Diode (OLED) display device.

13. A method for manufacturing a display substrate, the display substrate comprising a display region and a GOA region, the method comprising:
  forming a first oxide semiconductor layer and a second oxide semiconductor layer sequentially at the GOA region;
  patterning the second oxide semiconductor layer and the first oxide semiconductor layer to form an active layer of a TFT; and
  forming an active layer of a TFT at the display region by the first oxide semiconductor layer,
  wherein the first oxide semiconductor layer has a carrier mobility smaller than the second oxide semiconductor layer.

14. The display device according to claim 11, wherein the carrier mobility of the second oxide semiconductor layer is more than 30 cm$^2$/(V·S).

15. The display device according to claim 11, wherein the second oxide semiconductor layer is made of IGZYO or IGTO, where Y represents Sn.

16. The display device according to claim 15, wherein a content of In is six times of a content of Ga in the second oxide semiconductor layer, and a content of O accounts for 10% to 35%.

17. The display device according to claim 16, wherein contents of elements in IGZYO meet an equation of In:Ga:Zn:Sn=6:1:4:1.

* * * * *